(12) United States Patent
Corum

(10) Patent No.: US 8,629,734 B2
(45) Date of Patent: Jan. 14, 2014

(54) SYSTEMS AND METHODS FOR POWER SMOOTHING IN POWER DISTRIBUTION

(75) Inventor: James F. Corum, Morgantown, WV (US)

(73) Assignee: CPG Technologies, LLC, Newbury, OH (US)

(*) Notice: Subject to any disclaimer, the term of this patent is extended or adjusted under 35 U.S.C. 154(b) by 2522 days.

(21) Appl. No.: 11/069,682

(22) Filed: Mar. 1, 2005

(65) Prior Publication Data

US 2006/0190513 A1    Aug. 24, 2006

Related U.S. Application Data

(63) Continuation-in-part of application No. 11/062,179, filed on Feb. 18, 2005, now abandoned.

(51) Int. Cl.
*H01P 5/12* (2006.01)
*H01P 5/18* (2006.01)
*H01P 5/22* (2006.01)

(52) U.S. Cl.
USPC ......... 333/109; 333/112; 333/114; 73/514.39

(58) Field of Classification Search
USPC ............ 324/173–174, 207.2, 207.21, 207.25, 324/251, 252; 73/514.31, 514.39; 333/109, 333/116, 156, 161, 995, 128, 112, 118
See application file for complete search history.

(56) References Cited

U.S. PATENT DOCUMENTS

| | | | |
|---|---|---|---|
| 2,410,114 A * | 10/1946 | Tyrrell | 333/118 |
| 3,012,203 A | 12/1961 | Ping | |
| 3,300,728 A * | 1/1967 | Adler | 330/4.7 |
| 3,435,342 A | 3/1969 | Bumsweig et al. | |
| 3,501,164 A | 3/1970 | Peterson | |
| 3,539,948 A * | 11/1970 | Salzberg | 333/112 |
| 3,562,523 A * | 2/1971 | Richardson et al. | 250/259 |
| 3,631,534 A | 12/1971 | Hirota et al. | |
| 3,663,948 A | 5/1972 | Nagae et al. | |
| 3,771,077 A | 11/1973 | Tischer | |
| 3,829,881 A | 8/1974 | Kohashi | |
| 4,009,444 A | 2/1977 | Farkas et al. | |
| 4,041,366 A * | 8/1977 | Bauer | 363/61 |
| 4,467,269 A | 8/1984 | Barzen | |
| 4,622,558 A | 11/1986 | Corum | |
| 4,749,950 A | 6/1988 | Farkas | |

(Continued)

FOREIGN PATENT DOCUMENTS

| | | |
|---|---|---|
| CA | 1186049 | 4/1985 |
| EP | 0043591 | 1/1982 |
| SE | 152491 | 11/1955 |

OTHER PUBLICATIONS

Adler, R.B., L.J. Chu, and R.M. Fano, *Electromagnetic Energy Transmission and Radiation*, Wiley, 1960, p. 31-32.

(Continued)

*Primary Examiner* — Gary L Laxton
*Assistant Examiner* — Nusrat Quddus
(74) *Attorney, Agent, or Firm* — Thomas|Horstemeyer, LLP.

(57) ABSTRACT

A system for power smoothing in power distribution and methods are provided. In one embodiment, a power multiplying network is provided that comprises a multiply-connected, velocity inhibiting circuit constructed from a number of lumped-elements. The power multiplying network is coupled to a power distribution network. The power multiplying network is configured to store power from and supply power to the power distribution network.

32 Claims, 12 Drawing Sheets

(56) References Cited

U.S. PATENT DOCUMENTS

| | | | |
|---|---|---|---|
| 4,751,515 A | | 6/1988 | Corum |
| 4,851,795 A | * | 7/1989 | Beckwith ............... 333/100 |
| 4,893,098 A | * | 1/1990 | Seely et al. ............ 333/112 |
| 5,075,624 A | * | 12/1991 | Bezjak ................ 324/318 |
| 5,175,517 A | * | 12/1992 | Dydyk et al. ............ 333/118 |
| 5,406,237 A | | 4/1995 | Ravas et al. |
| 5,633,648 A | | 5/1997 | Fischer |
| 5,748,295 A | | 5/1998 | Farmer |
| 5,764,123 A | * | 6/1998 | Waters ............... 336/84 R |
| 5,770,992 A | * | 6/1998 | Waters ............... 336/84 R |
| 5,949,311 A | * | 9/1999 | Weiss et al. ........... 333/202 |
| 6,121,693 A | | 9/2000 | Rock |
| 6,459,247 B1 | | 10/2002 | Benes |
| 6,522,030 B1 | | 2/2003 | Wall et al. |
| 6,611,181 B2 | | 8/2003 | Marketkar et al. |
| 6,653,821 B2 | | 11/2003 | Kern et al. |
| 6,653,827 B2 | | 11/2003 | Gaither et al. |
| 6,654,216 B2 | | 11/2003 | Horvath et al. |
| 6,696,838 B2 | | 2/2004 | Raftery et al. |
| 6,788,163 B2 | | 9/2004 | Benham et al. |
| 6,990,327 B2 | | 1/2006 | Zheng et al. |
| 7,033,406 B2 | | 4/2006 | Weir et al. |
| 7,050,913 B2 | | 5/2006 | Cox |
| 7,197,113 B1 | * | 3/2007 | Katcha et al. ........... 378/101 |
| 7,583,143 B2 | | 9/2009 | Pan |
| 7,619,325 B1 | * | 11/2009 | Hennessy et al. .......... 307/147 |
| 2002/0149535 A1 | | 10/2002 | Toncich |
| 2005/0122186 A1 | * | 6/2005 | Podell .................. 333/112 |
| 2006/0190512 A1 | | 8/2006 | Corum |
| 2006/0212176 A1 | | 9/2006 | Corum |
| 2008/0185916 A1 | | 8/2008 | Corum et al. |
| 2008/0186646 A1 | | 8/2008 | Corum |

OTHER PUBLICATIONS

Collin, R.E., Foundations for Microwave Engineering, McGraw-Hill, 1966, pp. 80-89, 144-197.
Corum, J.F. and K.L. Corum, "RF Coils, Helical Resonators and Voltage Magnification by Coherent Spatial Modes," Microwave Review, Sep. 2001, pp. 36-45.
Corum, J.F., "A Concentric Array for Low and Medium Frequencies," 1990 IEEE Antennas and Propagation Society International Symposium Digest, Dallas, Texas, May 1990, vol. 2, pp. 832-835.
Corum, J.F., "A Novel Structure for Improved Directivity," Proceedings of the 1988 IEEE Antennas and Propagation Society International Symposium, Syracuse, New York, Jun. 1988, pp. 824-827.
Corum, J.F., "Experimental Validation of the Improved Directivity Element—Elevation Plane Control," Proceedings of the 1989 IEEE Antennas and Propagation Society International Symposium, San Jose, California, 1989, pp. 702-705.
Corum, J.F., "Toroidal Helix Antenna," Proceedings of the 1987 IEEE Antennas and Propagation Society International Symposium, Blacksburg, Va., Jun. 1987, pp. 832-835).
Corum, J.F., "Vehicular Wide-Band Antenna System," Tactical Warfare Simulation and Technology Information Analysis Center, Battelle Memorial Institute, Final Report, US Army Missile Command Contract No. DAAH01-91-D-R006, Jun. 30, 1993, pp. 1-41.
Corum, J.F., B.F. Pinzone, and K.L. Corum, "A New Low Profile AntiSkywave Antenna for AM Broadcasting," Proceedings of the 1988 National Association of Broadcasters (NAB) 42nd Engineering Conference, Las Vegas, Nevada, Apr. 1988, pp. 7-15.
Corum, J.F., B.F. Pinzone, and K.L. Corum, "Antiskywave Antenna Design," Radio World, May 15, 1988, pp. 45-46.
Corum, K.L. and J.F. Corum, "Tesla and The Magnifying Transmitter," Proceedings of the 1992 International Tesla Symposium, International Tesla Society, 1992, pp. 55-78.
IEEE Standard Dictionary of Electrical and Electronics Terms, McGraw-Hill, second edition, 1977, p. 391.
Johnson, W.C., Transmission Lines and Networks, McGraw-Hill, 1950, pp. 117-120.
Nourai, A. "Comparison of the Costs of Energy Storage Technologies for T&D Applications", American Electric Power, downloaded from www.electricitystorage.org, Jul. 2004, pp. 1-30.

Paris, D.T. and F.K. Hurd, Basic Electromagnetic Theory, McGraw-Hill, 1969, pp. 512-527.
Terman, F.E., Radio Engineering Handbook, McGraw-Hill, 1943, pp. 172-178, 191-215.
International Search Report and Written Opinion for International Application No. PCT/US06/04324 mailed on Jun. 22, 2007.
International Search Report and Written Opinion for International Application No. PCT/US06/04522 mailed on Jun. 31, 2007.
International Search Report and Written Opinion for International Application No. PCT/US08/52387 mailed on Jul. 14, 2008.
International Search Report and Written Opinion for International Application No. PCT/US08/59414 mailed on Aug. 15, 2008.
International Search Report for PCT/US06/04522 dated Jan. 31, 2007.
International Search Report for PCT/US06/04324 dated Jun. 22, 2007.
Tischer, F.J., "Resonance Properties of Ring Circuits," IRE Transactions on Microwave Theory and Techniques, pp. 51-56, Jan. 1957.
Miller, S.J., "The Traveling Wave Resonator and High Power Microwave Testing," The Microwave Journal, pp. 50-58, Sep. 1960.
Young, L., "A Hybrid-Ring Method of Simulating Higher Powers than are Available in WaveGuides," Radio Section, Paper No. 1643, 1954.
Hayes, P.S. et al., "Methods of Producing High Levels of RF Power for Test Purposes," 1988 NAB Engineering Conference Proceedings, pp. 380-386, Apr. 1988.
Sferrazza, P.J., "A Traveling Wave Resonator," Proceedings of the National Electronics Conference, vol. 2, pp. 968-973, Oct. 1955.
Schwarzkopf, D.B., "The Traveling Wave Resonator as a Short Pulse Generator," Microwave Journal, pp. 172-180, Oct. 1962.
Tomiyasu, K., "Attenuation in a Resonant Ring Circuit," IEEE Transactions on Microwave Theory and Techniques, vol. MTT-8, pp. 253-254, Mar. 1960.
Milosevic, L.J. et al., "Traveling-Wave Resonators," IRE Transactions on Microwave Theory and Techniques, pp. 136-143, Apr. 1958.
Somlo, P.I., "Some Aspects of the Measurement of the Q Factor of Transmission Lines," IEEE Transactions on Microwave Theory and Techniques, pp. 472-478, Nov. 1963.
Oliver, B.M., "Directional Electromagnetic Couplers," Proceedings of the I-R-E, pp. 1686-1692, Nov. 1954.
Chiang, Yi-Chyun, et al., "Design of a Wide-Band Lumped-Element 3-dB Quadrature Coupler," IEEE Transactions on Microwave Theory and Techniques, pp. 476-479, Mar. 2001.
Franke, E., "Capacitively Coupled Hybrids," Ham Radio, pp. 70-78, Mar. 1983.
Kuecken, J.A., "Antennas and Transmissions Lines," Howard W. Sams & Co., New York, Chapter 23, pp. 194-159, 1969.
McWhorter, M., "Broadband RF Transformer Directional Couplers," RF Design, pp. 53-58, Jul. 1991.
Matthaei, G., "Microwave Filters, Impedance Matching Networks, and Coupling Structures," McGraw-Hill, Chapter 14, pp. 846-887, 1964.
Benahmend, N. et al., "Finite Element Analysis of RF Couplers with Sliced Coaxial Cable," Microwave Journal, pp. 106, 113-114, 116, 118, 120, Nov. 2000.
Seiler, et al., "Radio Frequency High Power Wattmeter Calibrator Prototype " Battelle Memorial Institute, Final Report, Air Force Contract No. F04606-89-D0334/TAL1, Feb. 1993.
Vinet, J.Y., "Optimization of Long-Baseline Optical Interferometers for Gravitational-wave Detection," The American Physical Society, vol. 38, No. 2, pp. 433-447, Jul. 1988.
Meers, B.J., "Recycling in laser-interferometric gravitational-wave detectors," The American Physical Society, vol. 38, No. 8, pp. 2317-2326, Oct. 1988.
Strain K. A., "Experimental Demonstration of Dual Recycling for Interferometric Gravitational-Wave Detectors," Physical Review Letters, The American Physical Society, vol. 66, No. 11, pp. 1391-1394, Mar. 1991.
Raab, F. J., "Recycling for a cleaner signal," Nature, vol. 351, pp. 98-100, May 1991.
Balakin, A. B., "A new approach to the detection of gravitational waves," American Institute of Physics, pp. 183-184, Feb. 1991.

(56) References Cited

OTHER PUBLICATIONS

Tomiyasu, K., "Effect of a Mismatching Ring in a Traveling-Wave Resonant Circuit," G.E. Microwave Lab, pp. 267 Sep. 1957.

Beckman, P., "Einstein Plus Two," The Golem Press, Boulder, CO, Chapter 2.12, "Radiation and Some Other Matters", pp. 156-162, 1987.

Statement of Facts Submitted Under 37 CFR 1.56.

Churchill, R.V., Complex Variables for Applications, 1960, pp. 111-112, McGraw-Hill, New York.

Guillemin, E.A., The Mathematics of Circuit Analysis, MIT Principles of Electrical Engineering Series, 1949, pp. 221-223, MIT Press, Cambridge.

IEEE Standard Dictionary of Electrical and Electronics Terms, F. Jay, editor, 2nd edition, 1977, p. 644, Wiley-Interscience, New York.

Kellogg, O.D., Foundations of Potential Theory, 1953, p. 74, Dover, New York.

Morse, P.M. et al., Methods of Theoretical Physics, 1953, p. 363, McGraw-Hill, New York.

Second Declaration of Dr. James F. Corum submitted in U.S. Appl. No. 11/751,343 on Feb. 1, 2011.

Schellkunoff, S.A., Applied Mathematics for Engineers and Scientists, Bell Laboratories Series in Electrical Engineering, 1965, pp. 303-306, Van Nostrand Reinhold, Co., New York.

Soklonikoff, I.S., Advanced Calculus, 1939, pp. 184-185, McGraw-Hill, New York.

Spiegel, M.R., Advanced Calculus, Schaum's Outline Series, 1963, pp. 102, 197, 204-205, Schaum Publishing Co., New York.

Spiegel, M.R., Vector Analysis, Schaum's Outline Series, 1959, pp. 109-110, 112-113, Schaum Publishing Co., New York.

Stratton, J.A., Electromagnetic Theory, 1941, p. 227, McGraw-Hill, New York.

Torre, E. Della et al., The Electromagnetic Field, Allyn and Bacon Series in Electrical Engineering, 1969, p. 132, Allyn and Bacon, Inc., Boston.

\* cited by examiner

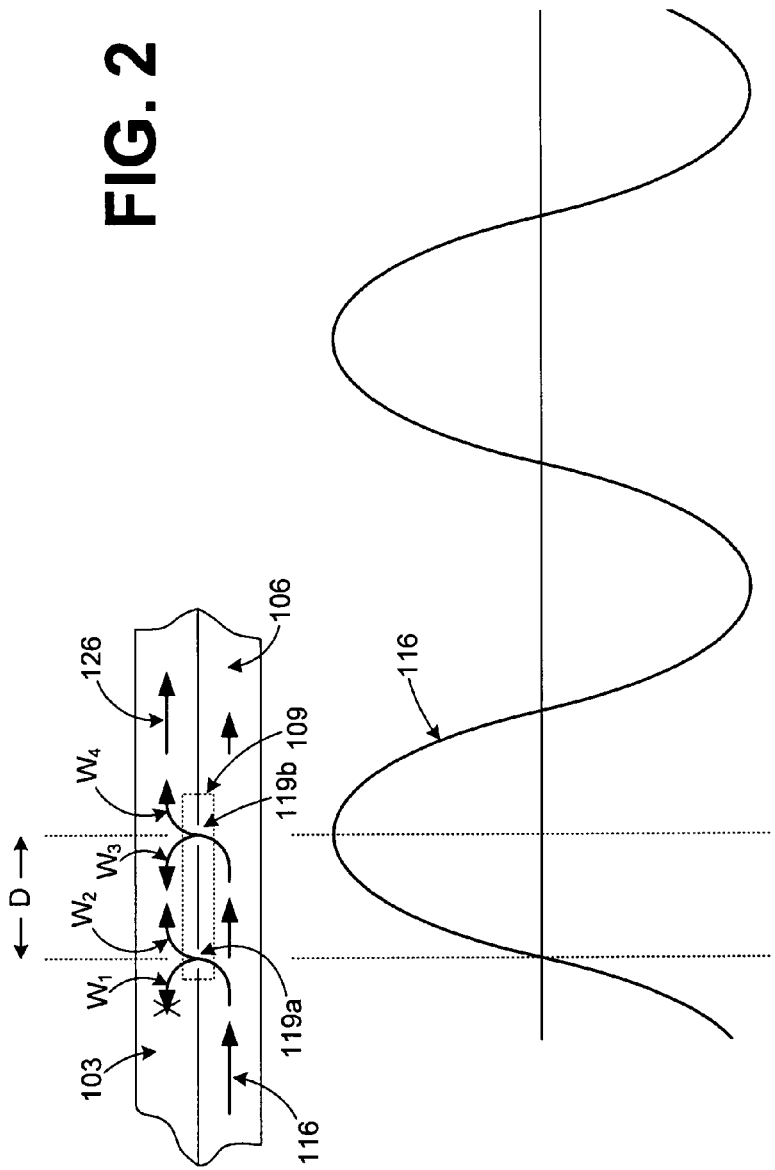

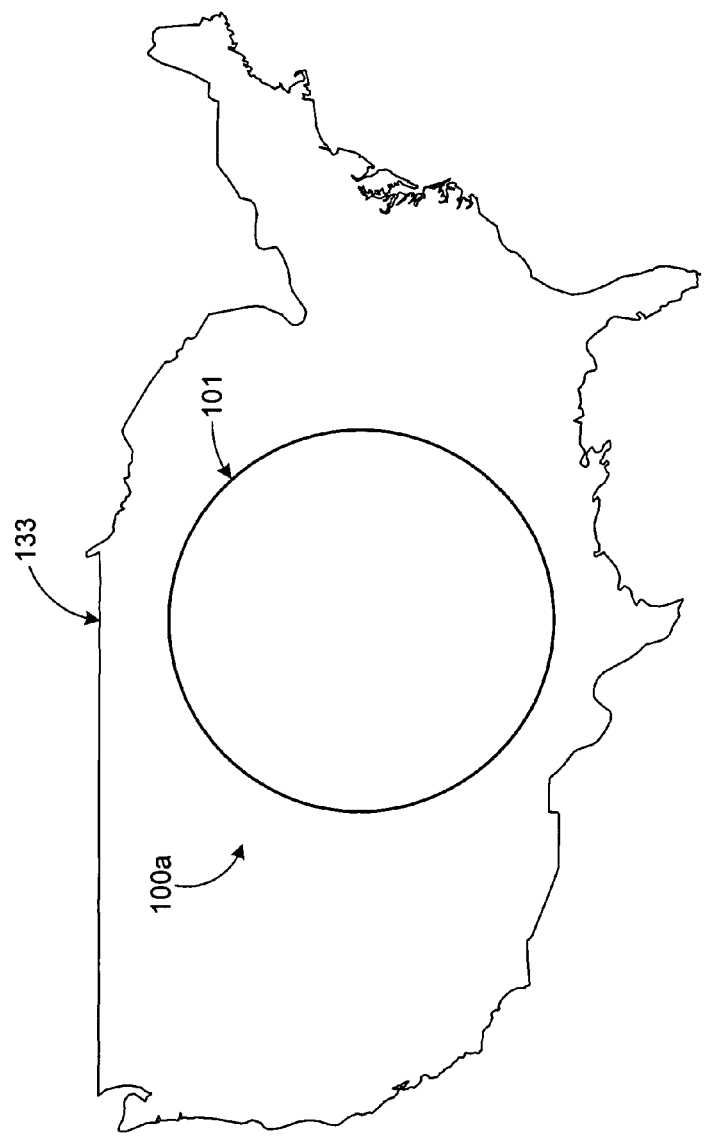

US 8,629,734 B2

SYSTEMS AND METHODS FOR POWER SMOOTHING IN POWER DISTRIBUTION

CROSS REFERENCE TO RELATED CASES

This application is a Continuation-in-Part Application of U.S. patent application Ser. No. 11/062,179 filed on Feb. 18, 2005 now abandoned entitled "USE OF ELECTRICAL POWER MULTIPLICATION FOR POWER SMOOTHING IN POWER DISTRIBUTION". This application is also related to co-pending U.S. patent application entitled "ELECTRICAL POWER MULTIPLICATION" filed on Mar. 1, 2005 herewith and assigned application Ser. No. 11/069,476.

BACKGROUND

Power multiplication may be desirable for many applications that require significant power resources that cannot be economically or physically provided given the current state of power technology. For example, some have attempted to use conventional mechanical flywheel and capacitive storage arrangements for energy storage and power multiplication. However, such approaches are often inadequate due to the decay in amplitude and/or frequency of power output as stored energy is extracted or released.

Power multiplication may also be achieved electrically using an electromagnetic path configuration for accumulating electrical energy and stepping up or magnifying real AC power. Such technology has been taught by Tischer, F. J., *Resonance Properties of Ring Circuits*, IEEE Transactions on Microwave Theory and Techniques, Vol. MTT-5, 1957, pp. 51-56. The power multiplier suggested by Tischer makes it possible to obtain practical power multiplication of 10 to 500 times the output power level of a given generator. The power multiplication is obtained without appreciable decay in either amplitude or frequency.

However, the power multiplier suggested by Tischer operates at relatively short wavelengths where the physical circumference of the device is on the order of an integral number of free space wavelengths given that the electrical length of the electromagnetic path suggested by Tischer equals an integer multiple of the wavelength of a traveling wave multiplied therein. At such short wavelengths, the physical size of the electromagnetic path is such that it can be practically constructed. However, power multiplication using an approach suggested by Tischer is not practical at lower power frequencies such as 60 Hertz with relatively long wavelengths as the size of the electromagnetic path would be on the order of several hundred miles.

In current electrical distribution systems such as the North American power grid it is often the case that Utilities experience severe mismatches between peak and average load demands. This can result in brown outs and blackouts in the system. Also, the North American power grid is being stretched to capacity. Consequently, it can be the case that brown outs and black outs may start chain reactions in the power grid that results in loss of reliable power.

In addition, another problem that energy markets face is that intervening load points such as cities often separate power generation stations from remote electrical loads. During heavy load times, the demand throughput cannot be conveyed from the power generation stations to the remote loads around the intermediate cities.

BRIEF DESCRIPTION OF THE SEVERAL VIEWS OF THE DRAWINGS

The invention can be understood with reference to the following drawings. The components in the drawings are not necessarily to scale. Also, in the drawings, like reference numerals designate corresponding parts throughout the several views.

FIG. 2 is a drawing of a directional coupler of the power multiplier of FIG. 1;

FIG. 3 is a drawing of an impractical power multiplier with respect to a geographical map illustrating a problem of practicing power multiplication using a power multiplier illustrated in FIG. 1 at power frequencies of relatively small wavelengths;

DETAILED DESCRIPTION

Figure 1:
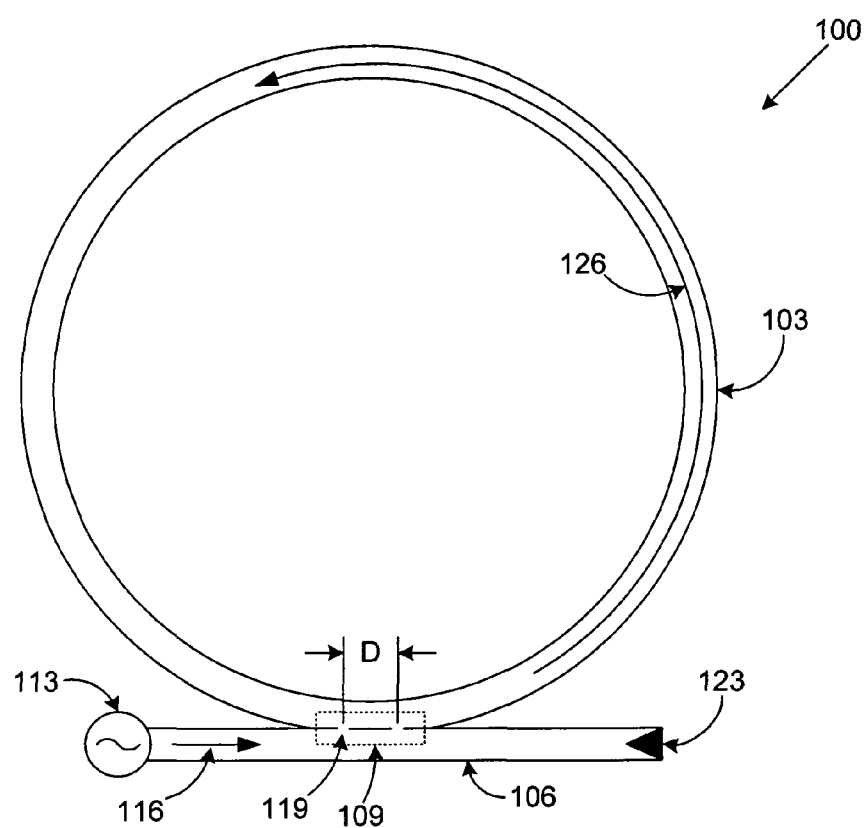
FIG. 1 is a drawing of a power multiplier according to the prior art.

With reference to FIG. 1, shown is a power multiplier 100 according to the prior art. The power multiplier 100 includes a power multiplying waveguide 103 and a launching waveguide 106. Both the power multiplying waveguide 103 and the launching waveguide 106 are conventional transmission lines such as hollow pipes, coaxial cables, parallel wire transmission lines. The launching waveguide 106 is coupled to the power multiplying waveguide 103 using a directional coupler 109. An electromagnetic signal generator 113 is coupled to the launching waveguide 106 and generates an exciting traveling wave 116 that is launched into the launching waveguide 106. The directional coupler 109 includes two slits 119 that are spaced apart by distance D. The distance D is approximately equal to ¼ of wavelength of the exciting traveling wave 116. Thus, the electromagnetic signal generator 113 generates the exciting traveling wave 116 at a predefined frequency having a wavelength $\lambda_w$ that is approximately four times the electrical distance $D/\lambda_w$. The launching waveguide 106 terminates in a matched load 123. The total length of the power multiplying waveguide 103 is an integer multiple of the wavelength $\lambda_w$ of the exciting traveling wave 116. In the case that the power multiplying waveguide 103 is a closed circle or closed ring as shown, the total length of the power multiplying waveguide is equal to its circumference.

To operate the power multiplier 100, the electromagnetic signal generator 113 generates the exciting traveling wave 116 that is launched in the launching waveguide 106. When the exciting traveling wave 116 reaches the directional coupler 109, a portion of the exciting traveling wave 116 is coupled into the power multiplying waveguide 103, thereby creating a traveling wave 126 that propagates along the power multiplying waveguide 103. The directional coupler 109 couples the portion of the exciting traveling wave 116 into the power multiplying waveguide 103 in such a manner that the traveling wave 116 travels in a single direction around the power multiplying waveguide 103. Specifically, since the distance D between the slits 119 is approximately equal to ¼ of the wavelength $\lambda_w$ of the exciting traveling wave 116, all energy coupled into the power multiplying waveguide 103 propagates in a single direction as will be further described with reference to later figures.

In addition, since the length of the power multiplying waveguide 103 is an integer multiple of the wavelength $\lambda_w$ of the exciting traveling wave 116, the traveling wave 126 is spatially synchronized with the exciting traveling wave 116. Under these conditions, the portion of the exciting traveling wave 116 that is continually coupled into the power multiplying waveguide 103 reinforces or is added to the traveling wave 126. Consequently, the power of the traveling wave 126 may become quite large in magnitude. That is to say, the Poynting's vector power flow, ½ Re{E×H*} is pumped up within the power multiplying waveguide, which is a linear, passive, distributed energy storage structure. The average energy of the traveling wave 126 is "distributed" in that it is evenly distributed throughout the entire length of the power multiplying waveguide 103.

Once begun, the buildup of the power of the traveling wave 126 within the power multiplying waveguide 103 will continue until the losses around the power multiplying waveguide 103 plus the loss in the matched load 123 that terminates the launching waveguide 106 is equal to the power generated by the electromagnetic signal generator 113. The power magnification M and optimum coupling $C_{Opt}$ may be calculated as follows:

$$M = \frac{1}{(1-A^2)}, \text{ and}$$

$$C_{Opt} = 1 - A^2,$$

where A is the field propagation decay for a single traversal of the power multiplying waveguide 103. The quantity of $C_{Opt}$ is that value of coupling for which the magnification is maximized.

The directional coupler has the property that energy leaking from the power multiplying waveguide 103 back into the launching waveguide 106 is reduced in magnitude. Also, energy leaking back into the launching waveguide 106 propagates only in a single direction towards the matched load 123 and, since such energy is of the correct phase, it cancels out the power propagating from the electromagnetic signal generator 113 to the matched load 123. Consequently, when the exciting traveling wave 126 and the traveling wave 126 are in phase, the matched load 123 dissipates little or no power.

Convenient nomograms for the engineering design of lossy power multipliers operating at ultra-high frequencies are described in Tomiyasu, K., "Attenuation in a Resonant Ring Circuit," *IEEE Transactions on Microwave Theory and Techniques*, Vol. MTT-8, 1960, pp. 253-254.

Referring next to FIG. 2, shown is a drawing of a portion of the power multiplying waveguide 103 and a portion of the launching waveguide 106. Also shown is the directional coupler 109. The drawing of FIG. 2 is provided to further explain the function of the directional coupler 109. To explain the operation of the directional coupler 109, the exciting traveling wave 116 is launched into the launching waveguide 106 and approaches the first slit 119a. A portion of the exciting traveling wave 116 enters the power multiplying waveguide 103 through the first slit 119a propagates in both directions within the power multiplying waveguide 103 as wave portion $W_1$ and wave portion $W_2$. The portion of the exciting traveling wave 116 that does not pass through the first slit 119a proceeds along the launching waveguide 106 until it reaches the second slit 119b. At this point, a second portion of the exciting traveling wave 116 enters the power multiplying waveguide 103 through the second slit 109b and propagates in both directions in the power multiplying waveguide 103 as wave portion $W_3$ and wave portion $W_4$. If the distance D between the slits is equal to ¼ of the wavelength $\lambda_w$ of the exciting traveling wave 116 as shown, then the wave portion $W_3$ cancels out the wave portion $W_1$. Also, the wave portion $W_2$ reinforces the wave portion $W_4$, thereby resulting in the traveling wave 126. As a consequence of the cancellation of wave portions $W_1$ and $W_3$, and the reinforcement of wave portions $W_2$ and $W_4$, the traveling wave 126 proceeds in a single direction around the power multiplying waveguide 126. Given that the exciting traveling wave 116 and the traveling wave 126 are in phase or are spatially synchronized, the portion of the exciting traveling wave 116 that is coupled into the power multiplying waveguide 103 is continually added to the traveling wave 126, thereby multiplying the power of the traveling wave 126. The power of the traveling wave 126 is real power. This is to say that there is no reactive component.

Referring next to FIG. 3, shown is a drawing of a map of the United States 133 that illustrates the problem that prevents the operation of power multipliers 100 at low frequencies such as power frequencies. Assume, for example, that the frequency of operation is 60 Hertz which represents the frequency of the power generation system of the United States. Assuming that the speed of light is approximately 300,000 km/sec, at 60 Hertz, the wavelength of both the exciting traveling wave 116 and the traveling wave 126 is calculated as:

$$\lambda_w = \frac{c}{f} \approx \frac{300{,}000 \text{ km/sec}}{60 \text{ Hz}} \approx 5000 \text{ km}.$$

Thus, the length or circumference of a hypothetical power multiplying waveguide 100a would have to be approximately 5000 Kilometers. Consequently, a corresponding hypothetical transmission line 101 employed in the power multiplying waveguide 100a would be approximately 5000 Kilometers in length. Obviously, due to the size involved, the creation of such a power multiplying waveguide 100a is not physically practical and is cost prohibitive.

Figure 4A:
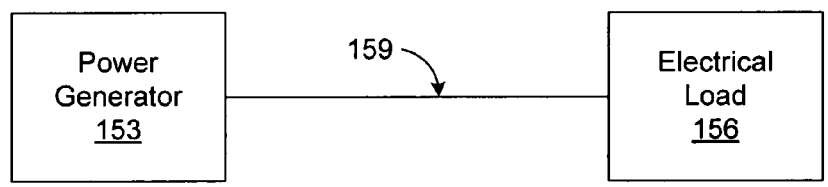
FIG. 4A is a block diagram of power transmission line from a power generator to an electrical load.

Turning then to FIG. 4A, we turn our attention to a discussion of power transmission lines. In FIG. 4A, a power generator 153 is electrically coupled to an electrical load 156 by a power transmission line 159. Such a transmission line 159 may be traditionally employed, for example, to distribute power to homes and businesses as can be appreciated by those with ordinary skill in the art.

Figure 4B:
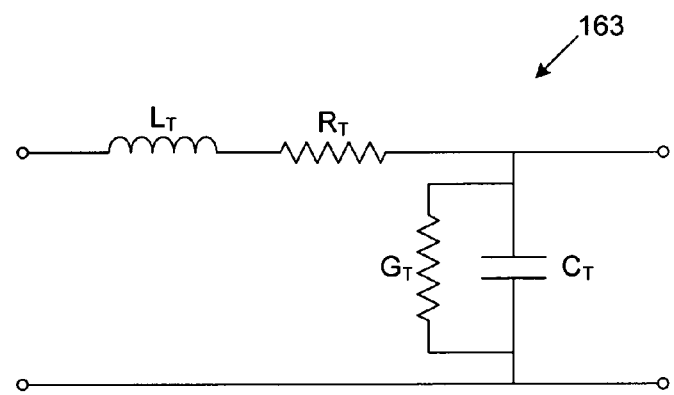
FIG. 4B is a schematic of an equivalent impedance per length of transmission line of FIG. 4.

Referring next to FIG. 4B, shown is an equivalent circuit 163 that illustrates the equivalent impedance per unit length of the transmission line 159 (FIG. 4A). Specifically, each unit length of the transmission line 159 includes series inductance $L_T$ and series resistance $R_T$. Also, between the conductors of the transmission line 159 are a shunt capacitance $C_T$ and a shunt conductance $G_T$. Accordingly, the equivalent impedance per unit length of the transmission line 159 may be expressed in terms of a series inductance $L_T$, a series resistance $R_T$, a shunt capacitance $C_T$, and a shunt resistance $R_T$.

The equivalent circuit 163 reflects that fact that transmission lines 159 direct the propagation of field energy. The field energy propagating along a transmission line 159 is stored in the magnetic fields and electric fields associated with the structure of the transmission line 159 itself. On a mode-by-mode basis, one can equate the magnetic field energy stored in a transmission line 159 to the magnetic field energy stored in an equivalent distributed inductance. Also, the energy stored in the electric fields of the line can be equated to the energy stored in an equivalent distributed capacitance. Field power losses per unit length of the transmission line 159 can be equated to the equivalent series resistive and shunt conductive losses per unit length.

Figure 5:
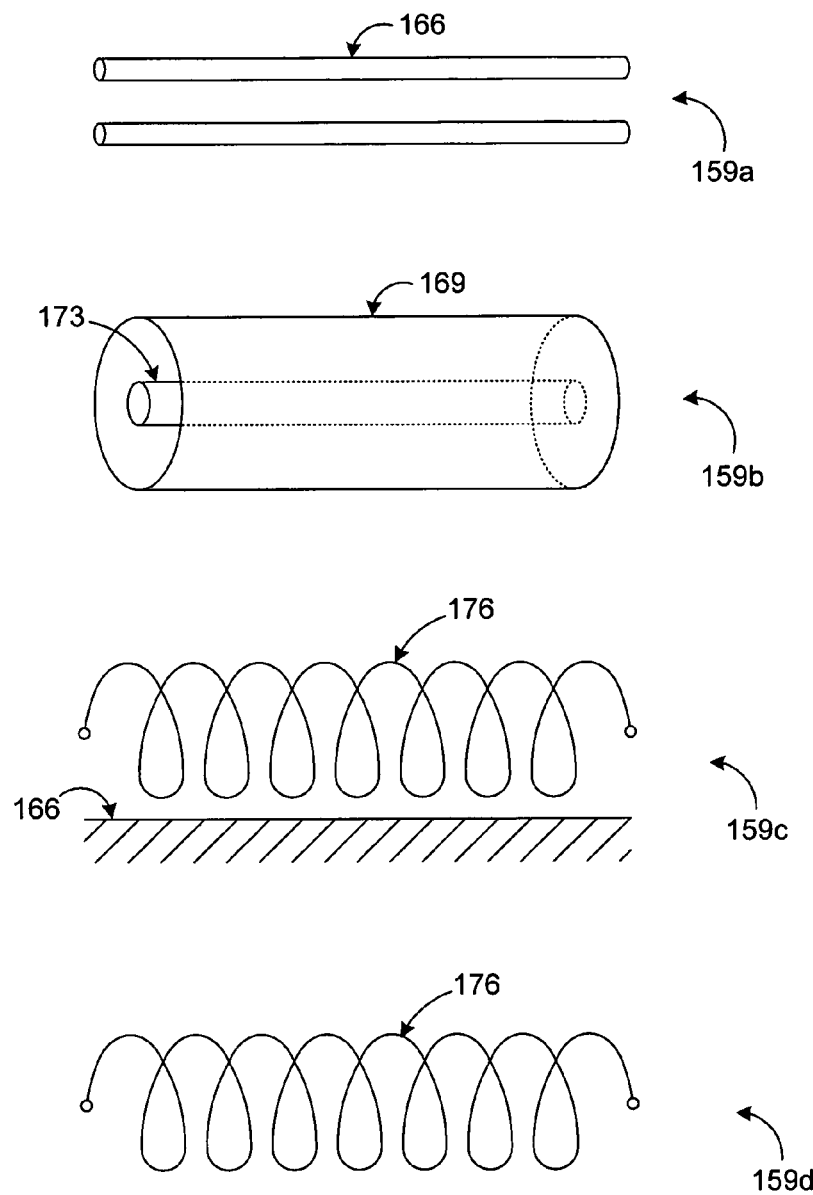
FIG. 5 is a drawing of alternative transmission lines that might be employed as the power transmission line of FIG. 4A and that have an equivalent impedance that can be modeled by the schematic of FIG. 4B.

Turning then to FIG. 5, shown are various embodiments of the transmission line 159 (FIG. 4A) for which the equivalent impedance may be expressed using the equivalent circuit 163 (FIG. 4B) discussed above. For example, transmission line 159 may comprise, for example, a parallel transmission line 159a that includes parallel conductors 166. Alternatively, the transmission line 159 may comprise a coaxial transmission line 159b that includes an inner conductor 169 and an outer conductor 173. In yet another alternative, the transmission line 159 may comprise an electrical structure 159c that includes a conductor 176 of a predefined geometry situated with respect to a ground plane 179. Alternatively, the conductor 176 may be situated with respect to a second such conductor rather than the ground plane 179. The predefined geometry of the conductor 176 may be, for example, a helix or other geometry. In still another alternative, the transmission line 159 may comprise an electrical structure 159d that comprises a single conductor 181 in the form a helix or other appropriate shape. In addition the transmission line 159 may comprise other types of transmission lines and electrical structures such as, for example, strip lines, fiber optic cables, and so on as can be appreciated by those with ordinary skill in the art.

Assuming that were actually possible to create the power multiplier 100a at power frequencies such as 60 Hertz, such a power multiplier 100a would involve the use of transmission wire in one of the configurations described above. In this respect, the impedance of such a transmission wire can be calculated and the equivalent impedance in terms of the series inductance $L_T$ (FIG. 4B), the series resistance $R_T$ (FIG. 4B), the shunt capacitance $C_T$ (FIG. 4B), and the shunt conductance $G_T$ (FIG. 4B) can be determined.

Figure 6A:
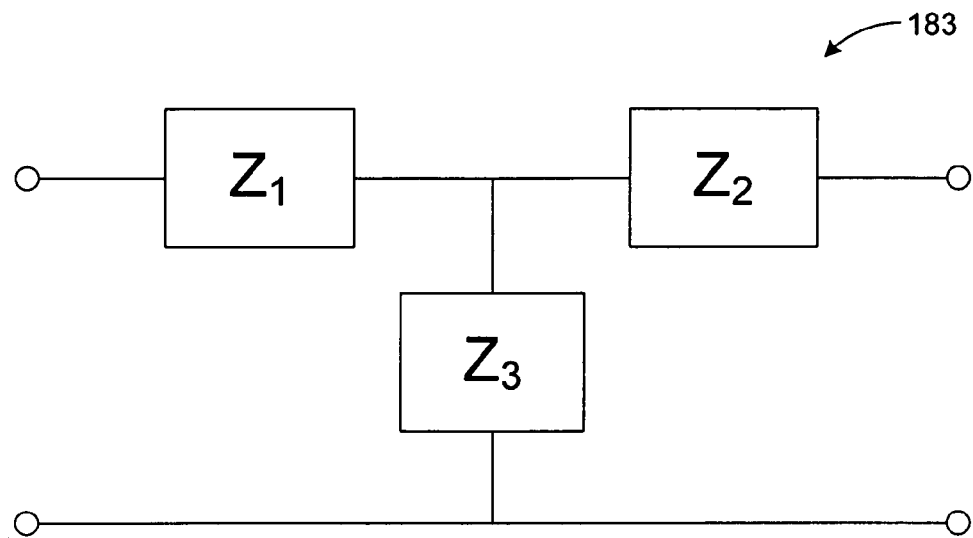
FIG. 6A is a schematic of a T-network employed in a power multiplier according to an embodiment of the present invention.
Figure 6B:
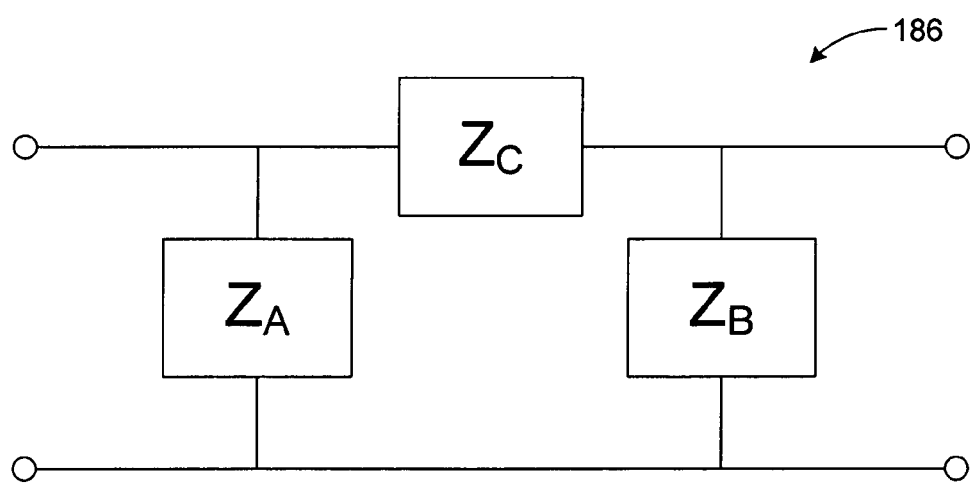
FIG. 6B is a schematic of a π-network employed in a power multiplier according to an embodiment of the present invention.

With reference to FIGS. 6A and 6B, shown are a T-network 183 and a π-network 186 that may be employed according to the various embodiments of the present invention. In this respect, the T-Network 183 includes series impedance $Z_1$ and series impedance $Z_2$. The T-Network 183 also includes parallel impedance $Z_3$. The characteristic impedance $Z_0$ of a symmetrical T-network 183 shown may be calculated as follows:

$$Z_0 = \sqrt{Z_1(Z_1 + 2Z_3)}.$$

The π-network 186 includes parallel impedances $Z_A$ and $Z_B$. The π-network 186 also includes series or middle impedance $Z_C$. The characteristic impedance $Z_0$ of a symmetrical π-network 186 may be calculated as follows:

$$Z_0 = Z_A \sqrt{\frac{Z_C}{(Z_C + 2Z_A)}}.$$

For further discussion of both the T-network 183 and/or the π-network 186, reference is made to Terman, F. E., *Radio Engineering Handbook*, McGraw-Hill, 1943, pp. 172-178, 191-215, which is incorporated herein by reference in its entirety. The T-network 183 and/or the π-network 186 may be employed, for example, in the construction of a power multiplier according to various embodiments of the present invention as will be discussed. In particular, the impedance represented by the T-network 183 and/or the π-network 186 are forms of the equivalent circuit 163 (FIG. 4B).

Figure 7A:
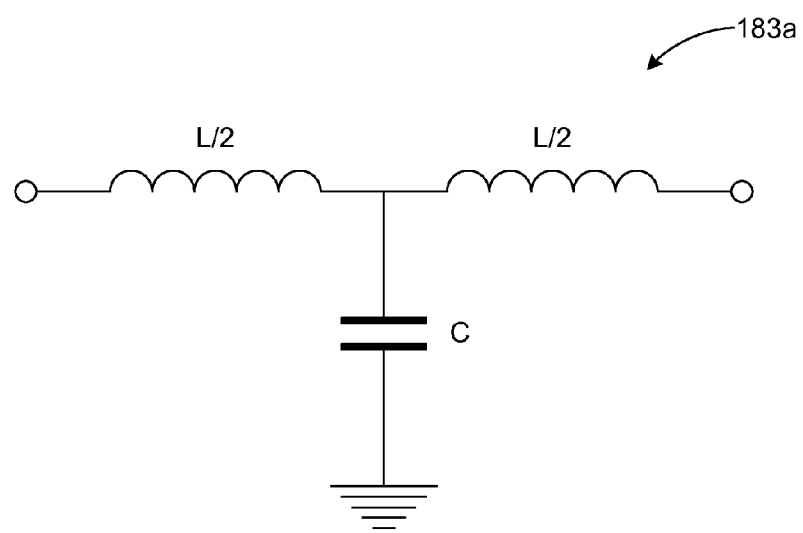
FIG. 7A is a schematic of an embodiment of the T-network of FIG. 6A.
Figure 7B:
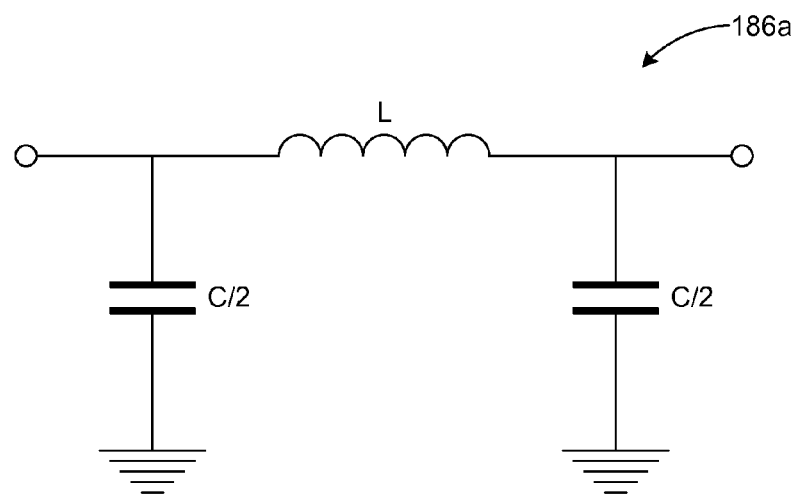
FIG. 7B is a schematic of an embodiment of the π-network of FIG. 6B.

Referring next to FIGS. 7A and 7B, shown are an example schematic of both a T-network 183a and a π-network 186a that may be employed in various embodiments of the present invention. In this respect, the T-network 183a includes series inductance L that is shown as two separate series inductances L/2. In addition, the T-network 183a also includes a shunt capacitance C. The T-network 183a includes a series loss resistances R and a shunt conductance G that are inherent in the conductors making up the inductances L/2, the capacitance C, and the electrical wire connecting such components.

The π-network 186a includes a series inductance L and shunt capacitances C/2. For multiple π-networks 186a that are coupled together in series, adjacent shunt capacitances C/2 may be added together to become capacitance C. The π-networks 186a also includes a series resistance R and a shunt conductance G that are inherent in the conductors making up the inductance L, the capacitances C/2, and the electrical wire connecting such components. The T-network 183a and π-network 186a illustrate more particular embodiments of the T-networks 183 or π-network 186.

Figure 8:
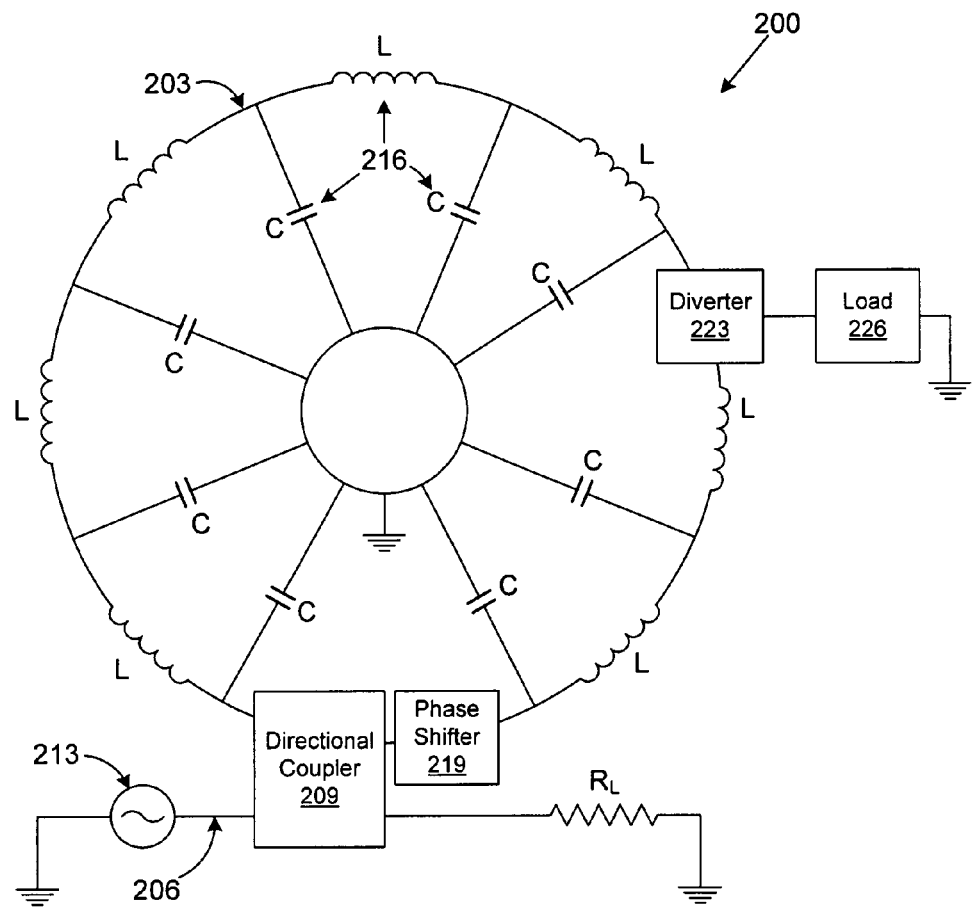
FIG. 8 is a schematic of a power multiplying network according to an embodiment of the present invention.

Turning then, to FIG. 8, shown is an example of a power multiplier 200 according to an embodiment of the present invention. The power multiplier 200 includes a power multiplying network 203 and a launching network 206. The launching network 206 also includes a directional coupler 209 that couples the launching network 206 to the power multiplying network 203. A power source 213 is coupled to the launching network 206. Also, the launching network 206 is terminated in a matching load $R_L$.

In one embodiment, the power multiplying network 203 is a multiply-connected, velocity inhibiting circuit constructed from a number of lumped-elements 216. As contemplated herein, the term "network" is defined as an interconnected structure of electrical elements. The terms "multiply-connected" is a mathematical term describing the existence of a closed path in a resonator, waveguide, or other electrical structure that cannot be reduced to a point without part of the closed path passing through regions that are external to the geometrical boundaries of the resonator, waveguide, or other electrical pathway. The power multiplying network 203 is "velocity inhibiting" as the electrical structure of the power multiplying network 203 results in a reduced velocity of propagation of an electromagnetic wave through the power multiplying network 203 relative to the speed of an electromagnetic wave through free space, which is the speed of light.

In addition, the term "lumped" is defined herein as effectively concentrated at a single location. Thus, the terms "lumped-elements" refer to discrete, two-terminal, concentrated electrical elements such as capacitance, inductances, resistance, and/or conductance. Thus, the lumped-elements as described herein may comprise discrete inductors, capacitors, or resistors. In addition, as contemplated herein, lumped-elements may also comprise diodes, transistors, and other semi-conductors that may be described, for example, as nonlinear resistors or conductors that have resistance or conductance that is controlled by the polarity of applied voltages or currents, etc. In addition, lumped-elements may also comprise inherent capacitances, inductances, resistances, or conductances of various electrical structures such as helices, parallel plates, or other structure as will be discussed. Similar to the power multiplying network 203, the directional coupler 209 is also constructed using lumped-elements.

The power multiplying network 203 is a velocity inhibiting circuit that results in a slower velocity of propagation of an electrical disturbance such as a traveling wave. In this respect, the power multiplying network 203 has an electrical length that is equal to an integer multiple of the wavelength of the operating frequency of the power source 213. Due to the velocity inhibited nature of the power multiplying network 203, its size is quite compact in comparison with the wavelength of the operating frequency of the power source 213. In addition, the direction coupler 209 causes a phase shift that is equal to one quarter of the wavelength of an exciting traveling wave generated by the power source 213 at the operating frequency as will be discussed.

In one embodiment, the power multiplying network 203 is constructed from lumped-elements 216 such as, for example, the inductances L and capacitances C as shown in FIG. 8. In one embodiment, the inductances L may be actual inductors and the capacitances C may be actual capacitors that are either commercially available or may be constructed as needed. For example, the power multiplying network 203 may be characterized as a ring of interconnected T-networks 183a (FIG. 7A) or π-networks 186a (FIG. 7B), although the interconnected T-networks 183a (FIG. 7A) or π-networks 186a (FIG. 7B) may be arranged in a multiply-connected structure other than a ring. Each of the T-networks 183a or π-networks 186a may be considered a "section" of the power multiplying network 203. In this respect, assuming that the power multiplying network 203 comprises a number of T-networks 183a, then each inductance L may be divided into two series inductances L/2 that make up the series inductances L/2 as described in the T-network 183a (FIG. 7A). Similarly, assuming that the power multiplying network 203 comprises a number of π-networks 186a, each capacitance C may be also be viewed as a pair of shunt capacitances C/2, each such shunt capacitance C/2 making up one of the shunt capacitances C/2 of the π-network 186a (FIG. 7B). Whether T-networks 183a or π-networks 186a are employed to create the sections of the power multiplying network 203, each of the networks 183a or 186a results in a predefined phase shift $\phi_S$.

Assuming that either T-networks 183a or π-networks 186a are to be employed to construct the power multiplying network 203 at some frequency f and some quality factor Q, then values for the lumped elements 216 such as the inductances L and capacitances C or other lumped elements are determined. The quality factor Q is defined conventionally as $Q = f/\Delta f.$ Such values may be calculated from the known characteristic impedance $Z_o$ and the transmission line complex propagation constant γ of a predetermined portion of the hypothetical transmission line 101 (FIG. 3) of the hypothetical power multiplier 100a. In this respect, the characteristic impedance $Z_o$ and the transmission line complex propagation constant γ may be calculated for a predefined unit length of the hypothetical transmission line 101 as follows:

$Z = R_T + j\omega L_T,$ $Y = G_T + j\omega C_T,$ $Z_o = \sqrt{Z/Y} = \sqrt{(R_T + j\omega L_T)/(G_T + j\omega C_T)},$ and $\gamma = \sqrt{ZY} = \sqrt{(R_T + j\omega L_T)(G_T + j\omega C_T)},$ where Z is the series impedance per unit length of transmission line, Y is the shunt admittance per unit length of transmission line. In the low loss case (i.e. $R_T \approx 0$ and $G_T \approx 0$), the characteristic impedance reduces to $Z_o = \sqrt{L_T/C_T}.$ In addition, the velocity of propagation may be calculated as $$v = \frac{1}{\sqrt{L_T C_T}}.$$

In order to determine values for $R_T$, $L_T$, $G_T$, and $C_T$, for a given section of transmission line 159, various references may be consulted that provide such information such as, for example, Terman, F. E., *Radio Engineering Handbook*, McGraw-Hill, 1943, pp. 172-178, 191-215, or other references as can be appreciated.

Once the characteristic impedance $Z_o$ for a predefined portion of the hypothetical transmission line 101 is known, then the complex electrical length θ of the predefined portion of the hypothetical transmission line 101 is calculated as $\theta = \gamma l$ where l is the physical length of the predefined portion of the hypothetical transmission line 101. Given the characteristic impedance $Z_o$, the transmission line complex propagation constant γ, and the electrical length θ of the predefined portion of the hypothetical transmission line 101, the series impedances $Z_1$ and $Z_2$, and the shunt impedance $Z_3$ of the T-network 183 (FIG. 6A) may be calculated as follows:

$Z_1 = Z_2 = Z_o \tan h(\theta/2),$ and $Z_3 = Z_o/\sin h(\theta).$

Alternatively, the shunt impedances $Z_A$ and $Z_B$, and the middle impedance $Z_C$ of the π-network 186 may be calculated as follows:

$Z_A = Z_B = Z_o \cot h(\theta/2),$ and $Z_C = Z_o \sin h(\theta).$

Once the series impedances $Z_1$, and $Z_2$, and the shunt impedance $Z_3$ of the T-network 183, or the shunt impedances $Z_A$ and $Z_B$, and the middle impedance $Z_C$ of the π-network 186 are known, then corresponding values for L and C may be determined. Assuming, for example, that one has calculated the shunt impedances $Z_A$ and $Z_B$, and the middle impedance $Z_C$ of the π-network 186, then inductance L associated with the middle impedance $Z_C$ may be calculated therefrom where $Z_C = r + j\omega L.$ Also, the capacitance C associated with the shunt impedances $Z_A$ and $Z_B$ may be calculated where $$Z_A = Z_B = \frac{1}{j\omega C}.$$

It may be the case that L and C are too large to be practically represented in the form of a lumped element 216. If such is the case, then a reverse calculation or reverse mapping may be performed using known values for L and C to determine how much of the hypothetical transmission line 101 may be represented by a given T-network 183 or π-network 186. In this respect, one may determine how many T-networks 183 or π-networks 186 may necessarily be employed in a given power multiplying network 203. In this respect, values may be chosen for L and C in view of the calculated values for L and C identified above.

Assuming that the series impedances $Z_1$ and $Z_2$, and the shunt impedance $Z_3$ of the T-network 183 are calculated from predetermined values for L and C, then the characteristic impedance $Z_o$ and the transmission line complex propagation constant γ may be calculated as follows:

$$Z_o = \sqrt{Z_1(Z_1 + 2Z_3)}, \text{ and}$$

$$\gamma = \operatorname{Arc\,tanh}\left(\frac{\sqrt{Z_1(Z_1 + 2Z_3)}}{Z_1 + Z_3}\right).$$

Alternatively, assuming that the shunt impedances $Z_A$ and $Z_B$, and the middle impedance $Z_C$ of the π-network 186 are calculated from predetermined values for L and C, then the characteristic impedance $Z_o$ and the transmission line complex propagation constant γ may be calculated as follows:

$$Z_o = Z_A\sqrt{\frac{Z_C}{Z_c + 2Z_A}}, \text{ and}$$

$$\gamma = \operatorname{Arc\,tanh}\left(\frac{\sqrt{Z_C(Z_C + 2Z_A)}}{Z_A + Z_C}\right).$$

Once the length l of the hypothetical transmission line 101 that is represented by a specified T-network 183 or π-network 186 is known, then one can determine how many similar T-networks 183 or π-networks 186 are needed to simulate the impedance of the entire hypothetical transmission line 101. Thus, by performing the forward and reverse calculations described above, one can determine general values for the inductances L and capacitances C of the power multiplying network 203.

In addition, the power multiplying network 203 further comprises a phase shifter 219. The phase shifter 219 comprises a circuit constructed from lumped-elements that is combined in series with a portion of the directional coupler 209 to make up the inductance L of the specific section within which the directional coupler 209 is located.

The power multiplying network 203 also includes a diverter 223 that couples the power multiplying network 203 to a load 226. The diverter 223 is defined herein as an electrical element or circuit that may be employed to divert or redirect all or a portion of a traveling wave from the power multiplying network 203 to the load 226. In this respect, the diverter 223 may comprise, for example, a switch, relay, solid state switch, plasma switch, or other device with like capability. The diverter 223 may also be a circuit that presents an electric window that is biased using a predefined control voltage or current to divert the energy within a traveling wave to the load 226, depending upon the state of the control voltage or current, etc.

During operation, the power source 213 is employed to launch an exciting traveling wave in the launching network 206. The exciting traveling wave may be, for example, a sinusoidal wave or other appropriate shape. The directional coupler 209 couples at least a portion of the exciting traveling wave from the launching network 206 into the power multiplying network 203, thereby resulting in a traveling wave that propagates within the power multiplying network 203. Given that the electrical length of the power multiplying network 203 is an integer multiple of the wavelength of the power source 213 and that the directional coupler 209 is equal to ¼ of the wavelength of the power source 213, then the traveling wave that propagates within the power multiplying network 203 is continually reinforced by the portion of the exciting traveling wave that is coupled into the power multiplying network 203. Also, the traveling wave propagates in a single direction around the power multiplying network 203. This results in power magnification M of the power of the traveling wave by a predefined factor that may be many times greater than the power of the power source 213, depending upon the losses and tolerances of the lumped-elements 216 and other factors.

Both the exciting traveling wave launched into the launching network 206 and the traveling wave that propagates around the power multiplying network 203 may be AC power signals such as electrical power signals generated at 50 Hertz, 60 Hertz, 400 Hertz, or any other power frequency as can be found in the electrical generation systems in the United States and countries around the world. However, in any event, the frequency of the exciting traveling wave, the traveling wave, and the power source 213 may be any frequency possible, although they typically correspond to frequencies with wavelengths for which the closed path length of the power multiplying network 203 is approximately 1/10 the wavelength or less of the traveling wave.

When the exciting traveling wave is applied to the launching network 206, the power of the traveling wave continually increases with time until it reaches a maximum power. The maximum power is reached when the losses in the power multiplying network 203 plus the losses in the matching load $R_L$ are equal to the power supplied by the power source 213. When the maximum power is reached, the diverter 223 may be actuated to direct the traveling wave from the power multiplying network 203 to the electrical load 226. In a typical situation, it may take up to approximately a dozen cycles to reach maximum power in the power multiplying network 203, although it is possible that maximum power may be reached in more or less cycles. Alternatively, the diverter 223 may be actuated to direct the traveling wave from the power multiplying network 203 at any time deemed appropriate such as, for example, when the energy accumulated in the power multiplying network 203 reaches any predefined threshold, etc.

The power multiplier 200 provides significant advantages in that it facilitates real power multiplication at lower power frequencies such as the operating frequencies of electrical power distribution systems around the world that operate, for example, at 50 Hertz, 60 Hertz, 400 Hertz, or other low frequencies. The velocity inhibiting nature of the power multiplying network 203 facilitates the creation of a power multiplier 200 that can operate at such low power generation frequencies with astonishing size reduction. That is to say, where prior theory may have taught that power multipliers operating at conventional power generation frequencies might have required a hypothetical waveguide that extended for thousands of kilometers as discussed with reference to FIG. 3, now the same can be created in a compact size that fits, for example, in a small room.

The velocity of propagation of the traveling wave through the power multiplying network 203 relative to the velocity of a traveling wave through free space is described herein as the velocity factor. The velocity inhibiting nature of the power multiplying network 203 provides for velocity factors that are on the order of $1/1,000,000$, although even smaller velocity factors may be achieved.

In addition, the power multiplier 200 may further include a number of launching networks 206, each launching network 206 being coupled to the power multiplying network 203 by a directional coupler 209. Such a configuration would facilitate a corresponding increase in the rate at which the power of the traveling wave accumulates during operation of the power multiplier 200.

In an alternative embodiment, the traveling wave may be a solitary wave that propagates around the power multiplying network 203. In order to propagate a solitary wave around the power multiplying network 203, the power multiplying network 203 is constructed so as to include nonlinear elements such as, for example, diodes, transistors, or other active components so as to be nonlinear and dispersive. Thus, nonlinear components are defined herein as components that provide an output having an amplitude that is not linearly proportional to the input as can be appreciated by those with ordinary skill in the art. By constructing the power multiplying network 203 from a suitable network of nonlinear elements and/or a combination of linear and nonlinear elements, a solitary wave may be propagated around the power multiplying network 203. In this respect, the power source 213 would be a pulse generator that generates and launches an exciting traveling wave into the launching network 206. To achieve power multiplication, a solitary exciting traveling wave would have to be spatially synchronized with the solitary traveling wave. In addition, the launching network 206, the directional coupler 209, and the phase shifter 219 may be constructed to include elements that are nonlinear and dispersive in nature to facilitate the propagation of solitary waves there through.

It should be appreciated that as the gain of the power multiplying network 203 increases, its quality factor Q rises and its bandwidth BW narrows around the operating frequency. In one embodiment, this may be a desirable asset for a strictly monochromatic system. Should broader bandwidths BW be desired, the electrical bandwidth BW of the power multiplying network 203 may be tailored for the specific application. For example, low-loss power multiplying networks 203 with broader and controlled-shape passbands may be constructed following various electrical filter design. See for example, Matthaei, G. L., L. Young, and E. M. T. Jones, *Microwave Filters, Impedance Matching Networks, and Coupling Structures*, McGraw-Hill, 1964; and Fano, R. M., *Theoretical Limitations on Broadband Matching of Arbitrary Impedances*, Journal of the Franklin Institute, Vol. 249, 1950, pp. 53-83 and 129-155.

In another embodiment, the power multiplier 200 as described above may also be constructed incorporating so called "Tracking-Filter" design techniques such that the electrical passband of the power multiplier 200 can be dynamic and automatically controlled to coherently track frequency and phase variations of the power source 213 while maintaining the desired operational properties described above. In implementing a power multiplier 200 with a dynamic electrical passband, the frequency of the power source 213 is monitored and compared with the resonant frequency of the power multiplying network 203. An error signal may be generated from such a comparison and employed in a feedback loop to dynamically modify the ring component parameters such as the lumped-elements of the power multiplying network 203 to tune it to the spectral variations of the power source 213. In such case, the lumped-elements described above may be parametrically dynamic with variable parameters as can be appreciated.

Figure 9:
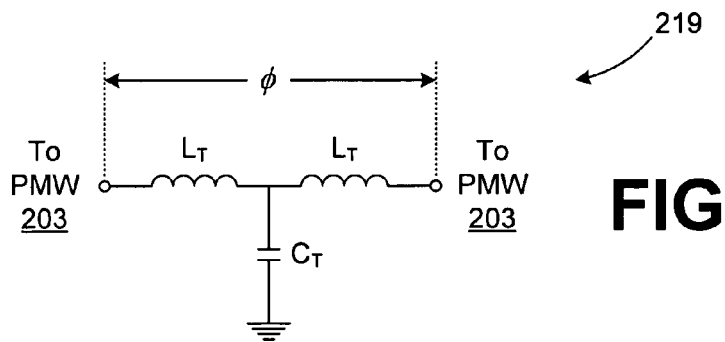
FIG. 9 is a schematic of a phase shifter employed in the power multiplier of FIG. 8 according to an embodiment of the present invention.

Referring next to FIG. 9, shown is a schematic that provides one example of the phase shifter 219 according to an aspect of the present invention. The phase shifter 219 comprises a T-network 183a (FIG. 7A), although a π-network 186a may be employed as well. In this respect, the phase shifter 219 includes series inductances $L_T$ and a shunt capacitance $C_T$. In this respect, the phase shifter 219 is constructed from lumped-elements as part of the power multiplying network 203.

The series inductances $L_T$ and the shunt capacitance $C_T$ are specified so as to result in a phase shift $\phi_S$. The series inductances $L_T$ and/or the shunt capacitance $C_T$ (assuming that a T-network 186a is employed) may be variable so as to allow the phase shift $\phi_S$ to be adjusted as necessary to compensate for any inaccuracies in the phase shifts $\phi_S$ of each section and in the phase shift θ of the directional coupler 209. This is done to ensure that the total phase shift presented by the power multiplying network 203 is an integer multiple of 360 degrees for the wavelength of the power source 213. The specific calculations that are performed to determine the values of the inductances $L_T$ and the shunt capacitance $C_T$ will be discussed.

Figure 10:
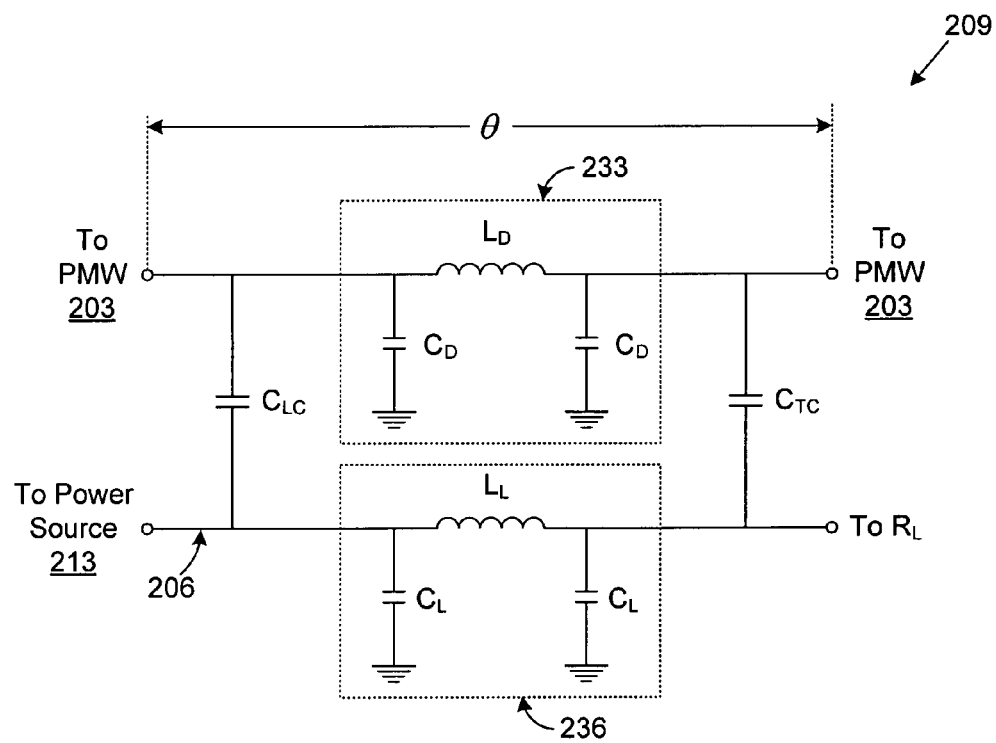
FIG. 10 is a schematic of a directional coupler employed in the power multiplier of FIG. 8 according to an embodiment of the present invention.

With reference to FIG. 10, shown is a schematic that illustrates an example of the directional coupler 209 according to an aspect of the present invention. The directional coupler 209 comprises a number of lumped-elements. In the example of FIG. 10, the directional coupler 209 comprises π-networks 233 and 236. Such a directional coupler 209 ensures that the traveling wave propagates in a single direction along the power multiplying network 203 and to achieve the reinforcement of the traveling wave with the portion of the exciting traveling wave that propagates through the launching network 206.

With the foregoing discussion of the power multiplying network 203, the directional coupler 209, and the phase shifter 219, the total phase shift presented by the power multiplying network 203 may be determined as follows:

$$\phi_{PMW} = \phi_s(N-1) + \phi + \theta,$$

where N is equal to the number of sections in the power multiplying network 203.

In addition, the diverter (FIG. 8) may be constructed in a manner similar to the directional coupler 209 in which the values of the coupling capacitances are used to control the rate at which energy exists the power multiplying network 203.

Figure 11:
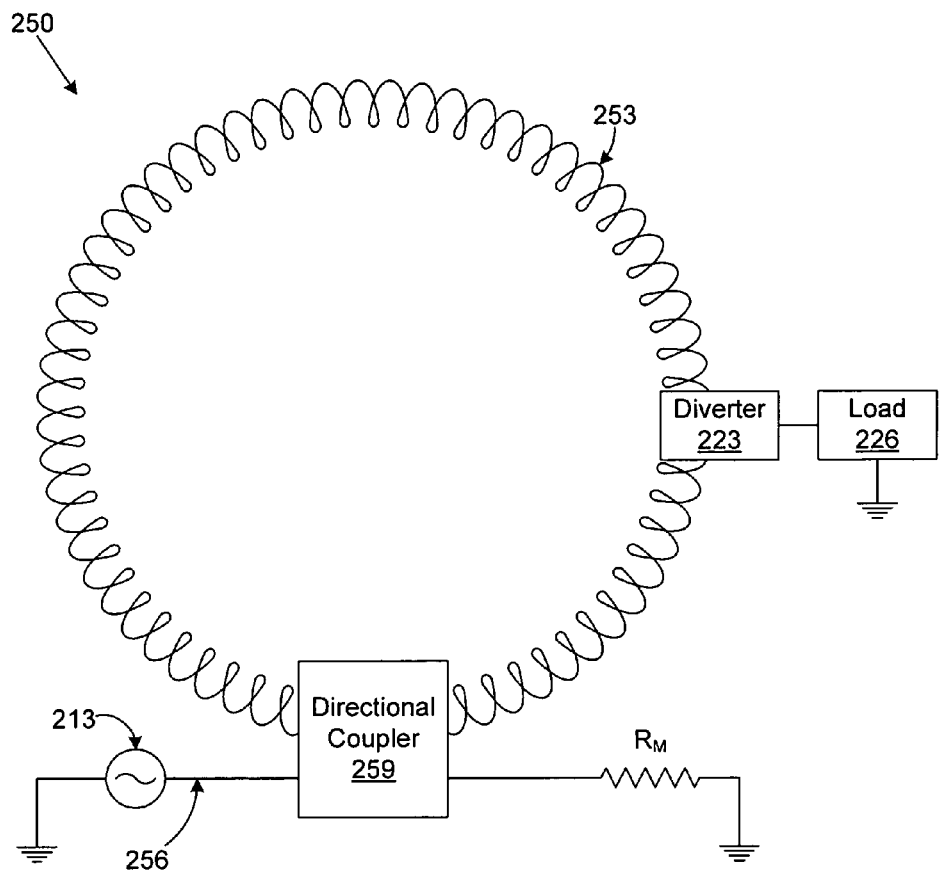
FIG. 11 is a schematic of a second power multiplier according to embodiment of the present invention.

Referring next to FIG. 11, shown is a schematic of a power multiplier 250 according to another embodiment of the present invention. The power multiplier 250 includes a power multiplying network 253 that is constructed from a toriodal helix as shown, or any of its variants comprising left handed, right handed, or superpositions of left and right handed helices as taught by Canadian Patent 1,186,049, U.S. Pat. No. 4,622,558, and U.S. Pat. No. 4,751,515, each of these references being filed by James F. Corum, the entire text of each of these references being incorporated herein by reference. In this respect, the toriodal helix includes the inductances L (FIG. 8) by virtue of its construction. In addition, the impedance presented by the toriodal helix includes capacitances as can be appreciated by those with ordinary skill in the art. (see Krause, John D., *Antennas*, McGraw-Hill, 1st edition, 1950, FIG. 7.2). The power multiplier 250 includes a launching network 256 that is coupled to the power multiplying network 253 by a directional coupler 259. The power multiplier 250 also includes the diverter 223 that couples an output from the power multiplier 250 to a load 226 as shown. The power source 213 is coupled to the launching network 256 and launches an exciting traveling wave into the launching network 256 in a similar manner as was described with reference to the power multiplier 200. Similarly, the launching network 256 is terminated in a matching load $R_M$.

The directional coupler 259 may be, for example, a section of the helix or even a π-network 186 (FIG. 7B) as shown. The directional coupler 259 imposes a phase shift of ¼ of the wavelength of the exciting traveling wave in a similar manner as was described above.

The operation of the power multiplier 250 is substantially similar as was discussed with reference to the power multiplier 200 of FIG. 8. The power multiplier 250 illustrates that fact that the power multiplying network 253 may comprise one or more electrical structures such as a toroidal helix, two or more cross-wound helices, a contrawound helix, or other electrical structures that include inherent capacitances and inductances that act as the lumped elements 216 (FIG. 8) such as the inductances L (FIG. 8) and capacitances C (FIG. 8).

With reference back to FIG. 8, once we have determined the values for the inductances L and capacitances C per section of the power multiplier 200 that comprises T-networks 183 (FIG. 6A) or π-Networks 186 (FIG. 6B), then actual power magnification that can be achieved by the resulting power multiplier 200 given the values for the lumped-elements (i.e. the shunt capacitances C and the series inductances L) may be determined. Specifically, the lumped-elements are specified to achieve a predefined phase shift per section at the predefined operating frequency.

The progression of calculations that is performed to determine the values for the lumped elements 216 such as the capacitances C and inductances L of the power multiplier 200 is now discussed. In the follow calculations, the assumption is made that each section of the power multiplying network 203 comprise π-networks 186 (FIG. 6B). To begin, the operating frequency f of the power multiplier 200 is specified. Also, both the inductance L and capacitance C of each section of the power multiplying network 203 are specified based upon the values for such elements identified above. In addition, a quality factor Q is specified for the inductances L of each section of the power multiplying network 203. The frequency in terms of radians/sec is calculated as $\omega = 2\pi f$ radians/sec.

Also, the resistance in each of each inductance L is calculated as $r = \omega L/Q$ Ohms.

Thereafter, the impedance $Z_C$ is calculated as follows:

$Z_C = r + i\omega L$ Ohms, where "i" represents $\sqrt{-1}$ as is known by those with ordinary skill in the art. Given the capacitances C specified above, the shunt impedances $Z_A$ and $Z_B$ are calculated as follows:

$$Z_A = Z_B = \frac{1}{i\omega C} \text{Ohms.}$$

Next, the characteristic impedance $Z_0$ is calculated as follows:

$$Z_0 = Z_A \sqrt{\frac{Z_C}{(Z_C + 2Z_A)}} \text{ Ohms.}$$

The characteristic impedance is defined as the ratio of the forward wave voltage over the forward wave current. In this respect, a physical measurement of the characteristic impedance of each section may be taken and compared with the calculated characteristic impedance $Z_0$ to verify the accuracy thereof.

In addition, the propagation constant γ per section is calculated as follows:

$$\gamma = a\tanh\left[\frac{\sqrt{Z_C(Z_C + 2Z_A)}}{(Z_A + Z_C)}\right].$$

The Attenuation Constant α per section and the Phase Constant β per section are defined as $\alpha_{section} = Re(\gamma)$ Nepers/section, and $\beta_{section} = Im(\gamma)$ radians/section.

The phase shift per section may then be calculated as $\phi = (57.296 \text{ Deg/Rad})\beta_{section}$ Degrees.

The velocity of the traveling wave in sections per second propagating along the power multiplying network 203 is calculated as $$v = \frac{\omega}{\beta_{section}} \text{ sections/second.}$$

Next, the electrical circumference $C_\gamma$ of the power multiplying network 203 is specified in terms of wavelengths at the operating frequency in degrees as $C_{Deg} = C_\lambda (360 \text{ Degrees/wavelength})$ Degrees.

Next, the number of sections N (either T-networks or π-networks) is calculated as $$N = \frac{C_{Deg}}{\phi}.$$

Once the number of sections N is known, then the loss resistance $R_C$ around the closed path of the power multiplying network 203 may be calculated as $R_C = Nr$ Ohms.

where r is as defined above. The field propagation decay A for a single traversal of the power multiplying network 203 may be calculated as $A = e^{-\alpha_{section} N}$.

The attenuation $A_{dB}$ around the power multiplying network 203 is calculated as $A_{dB} = -20 \log(A)$.

The pulse duration τ of a peripheral disturbance is calculated as $$\tau = \frac{N}{v} \text{ seconds.}$$

The power magnification M of the power multiplier 200 at optimum coupling is calculated as $$M = \frac{1}{(1-A^2)}.$$

The power magnification $M_{dB}$ expressed in decibels is calculated as $M_{dB} = 10 \log(M)$ The optimum coupling $C_{opt}$ is calculated as $C_{Opt} = 1 - A^2$.

The optimum coupling $C_{Opt}$ is calculated in decibels (dB) as $C_{optdB} = 10 \log(C_{opt})$ dB.

In addition, a useful reference that may be consulted to determine the various elements of the directional coupler 209 and the phase shifter 219 is Matthaei, G. L., L. Young, and E. M. T. Jones, *Microwave Filters, Impedance Matching Networks, and Coupling Structures*, McGraw-Hill, 1964, (see Chapter 14). While specific circuit designs may be discussed herein that may be employed as the directional coupler 209 and the phase shifter 219, it is understood that other circuit designs and circuit structures may be employed as well, such alternative designs falling within the scope of the present invention.

Figure 12:
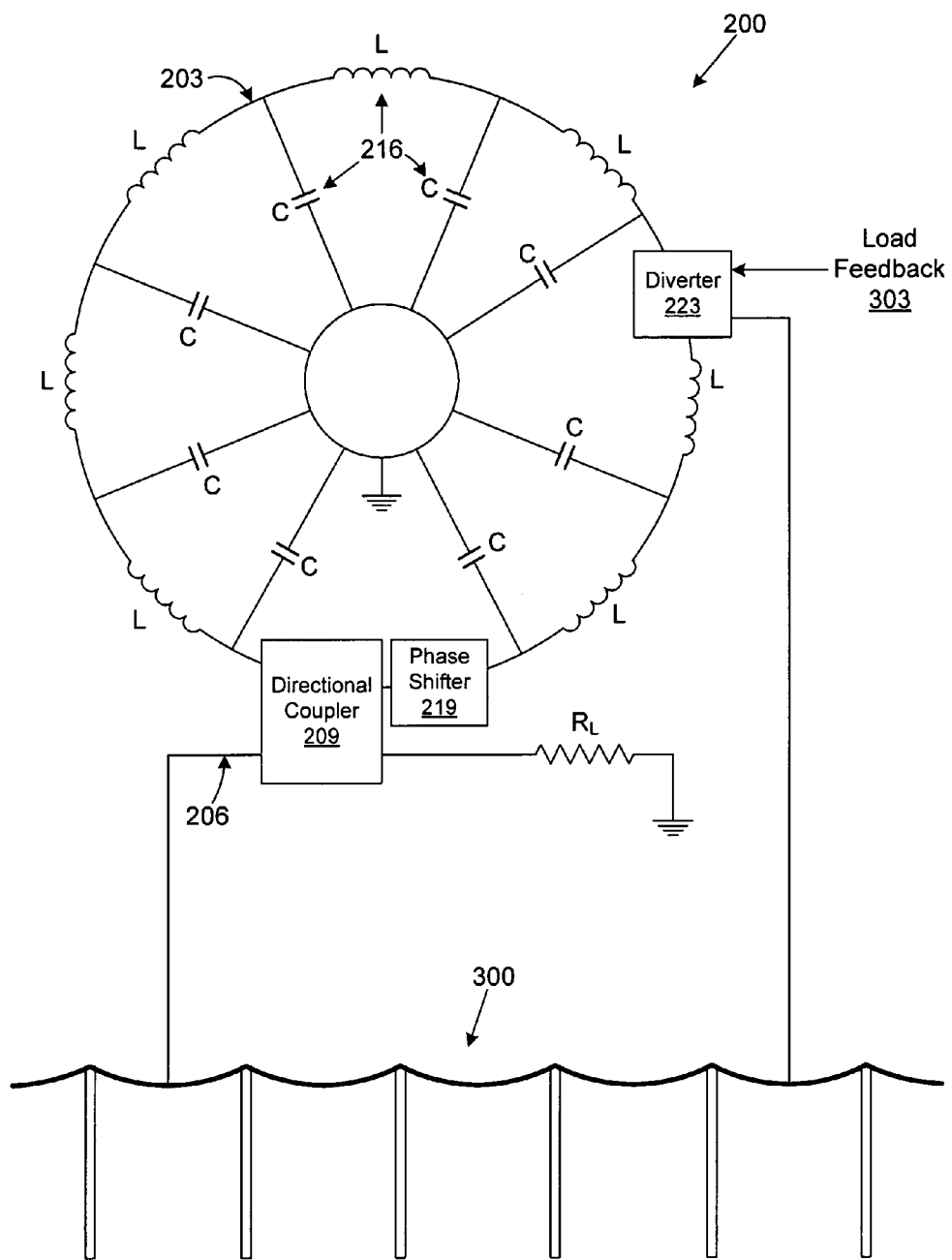
FIG. 12 is a schematic diagram of a power multiplier coupled to a power distribution network according to an embodiment of the present invention.

Referring next to FIG. 12, shown is the power multiplier 200 coupled to a power distribution network 300 according to one embodiment of the present invention. While the power multiplier 200 that employs the power multiplying network 203 is shown in FIG. 12, it is understood that other embodiments of power multipliers as described herein such as the power multiplier 250 may be employed, where the power multiplier 200 and the power multiplying network 203 are described herein merely as an example.

The power distribution network 300 may be, for example, a power grid such as the North American power grid or other power grids anywhere in the world. As shown in FIG. 12, the launching network 206 is coupled to the power distribution network 300. The output of the diverter 223 is also coupled to the power distribution network 300.

The diverter 223 receives a load feedback 303 that may comprise, for example, a load feedback signal generated based upon a current electrical load on the power distribution network 300. The directional coupler 209 may be selectively coupled to the launching network 206, or the launching network 206 may be selectively coupled to the power distribution network 300 in order to facilitate a controlled power input into the power multiplying network 203 from the power distribution network 300, thereby resulting in storage of power in the power multiplying network 203 of the power multiplier 200. Alternatively, the directional coupler 209 may be configured to control the rate at which power is input into the power multiplying network 203. By virtue of the fact that the launching network 206 and the diverter 223 are both coupled to the power distribution network 300, the power multiplying network 203 may be employed to store power from the power distribution network 300 and to supply power to the power distribution network 300 as desired.

The diverter 223 may be configured to control the output of the power multiplying network 203 in response to the load feedback 303. In this respect, the power stored in the power multiplying network 203 may be supplied, for example, to the power distribution network 300 to provide power upon an occurrence of an abrupt increase in the electrical load associated with the power distribution network 300.

Given that utilities that supply power to power distribution networks 300 can experience severe mismatches between peak and average load demands, the power multiplying network 203 may advantageously be employed for "power smoothing." For example, the power multiplying network 203 may be employed in locations local to electrical loads that may be remote from power generation stations to "smooth" brown outs and black outs by utilities with large peak-to-average load demands. In this respect, the power multiplying network 203 may be coupled to various locations of power distribution networks 300 to provide local controlled smooth transition between load states by providing for temporary energy storage that may be drawn upon as needed.

This may reduce the electro-mechanical stress on existing power generation equipment in electrical generation stations. Specifically, when large load swings and transients occur on the power distribution systems 300, significant electro-mechanical stresses can occur in rotating machinery used in power generation. For example, either a one time occurrence of a large transient or the repeated occurrences of smaller transients over time can result in the catastrophic failure of shafts and other mechanical components of electrical generators. Also, electrical wiring failure can occur in generators and at other points in electrical distribution systems. In addition, load swings and transients can affect the frequency and phase stability of electrical generators as they react to the changes in electrical loads. The power multiplying network can be employed to eliminate such stresses on power generation and distribution equipment, and can ensure frequency and phase stability in the existing power distribution networks 300.

In circumstances where there exists an intervening electrical load point such as a city between electrical generation stations and a remote load, it is possible that during heavy load times, the demanded throughput cannot be conveyed from the electrical generation station to the remote load through the intervening electrical load point. Thus, a power multiplier 200 that includes the power multiplying network 203, for example, may be employed to address the "rush hour" electrical traffic congestion problem around such intervening load point. For example, the power multiplying network 203 may be coupled to the power distribution network 300 near the intervening load point to provide for storage of power that can be accessed at such heavy traffic times, thus smoothing the demand and preventing loss of service at the remote load.

To facilitate effective power smoothing on a given power distribution network 300, one or more power multiplying networks 203 may be coupled to demand stressed portions of a given power distribution network 300. As described above, such demand stressed portions of a power distribution network 300 may be at locations near cities or other large loads that experience large peak-to-average load demands. Also, such demand stressed portions may be near intervening electrical load points. Additionally, other locations of various power distribution networks 300 may be demand stressed as will be appreciated.

The various embodiments of the power multipliers described herein, including the power multiplier 200 employing the power multiplying network 203, are ideal for power smoothing on a power distribution network 300 since the power stored in such power multiplying networks is available on a near instantaneous basis. Consequently, the power multiplying network 203 may be employed, for example, to supply power when generating equipment on the power distribution network 300 cannot react fast enough to compensate for abrupt changes such as increases in the electrical load. In this respect, one or more power multiplying networks 203, for example, may be employed to supply power to the power distribution network 300 for periods of time to facilitate the adjustment of power generation systems coupled to the power distribution network to supply power to the increased electrical load after the occurrence of the abrupt increase.

Figure 13:
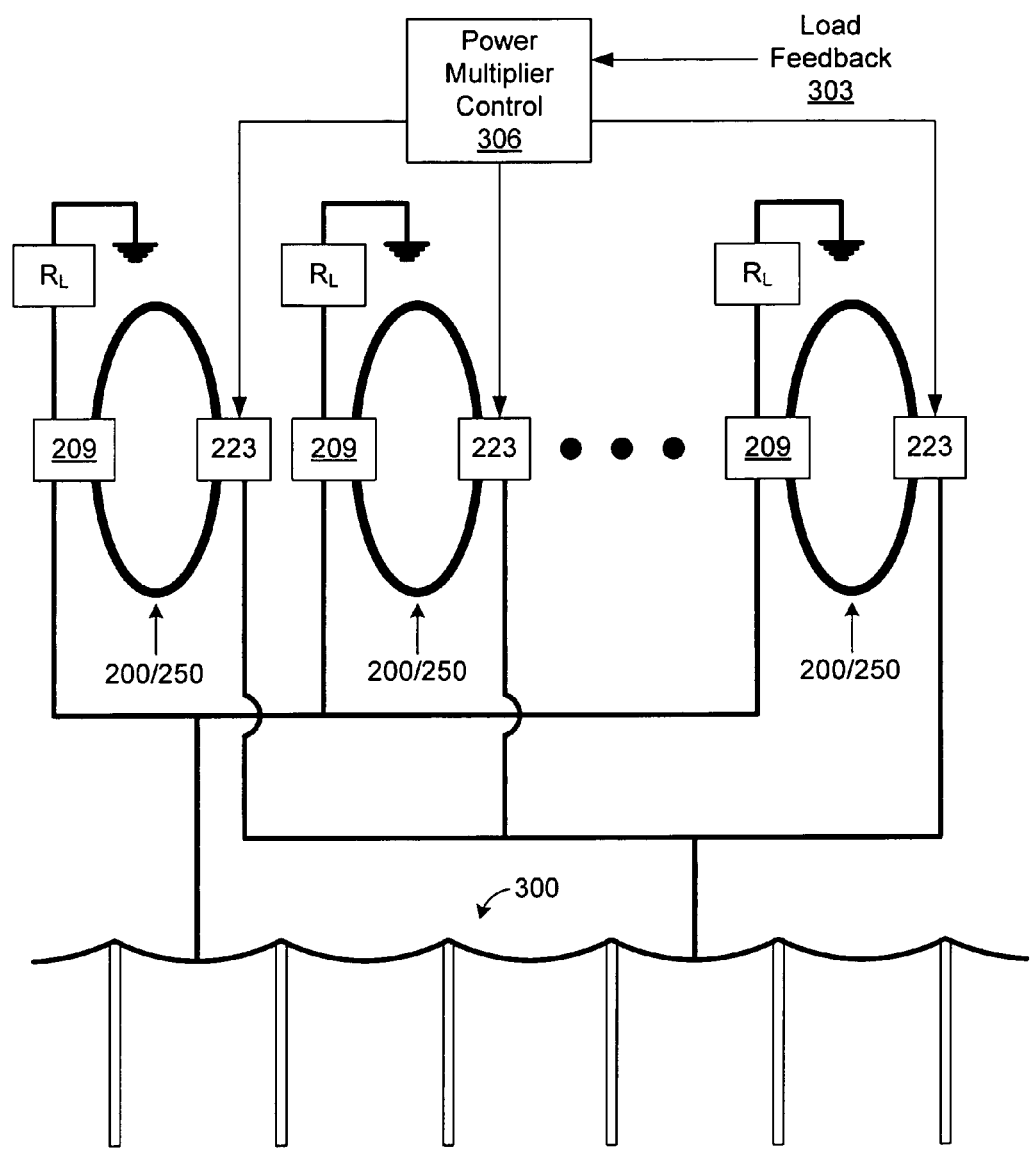
FIG. 13 is a schematic diagram of multiple power multiplier coupled to a power distribution network according to an embodiment of the present invention.

With reference to FIG. 13, shown are several power multipliers 200/250 that employ power multiplying networks 203/253 coupled to the power distribution network 300 according to another embodiment of the present invention. While the power multiplying networks 203/253 are shown, other embodiments of the power multiplying networks may be employed as can be appreciated. A power multiplier control system 306 is provided with outputs that are electrically coupled to each of the diverters 223 of the respective power multipliers 200/250.

The power multiplier control system 306 generates control outputs that are applied to the diverters 223 to control the release of power from each of the power multiplying networks 203/253 to the power distribution network 300 in response to the load feedback from the power distribution network 300. In one embodiment, the power multiplier control system 306 is configured to apply power from each of the power multiplying networks 203/253 to the power distribution network 300 in a sequential order. In this respect, the period of time that the power distribution network 300 may be supplied with power from the power multiplying networks 203/253 is increased based upon the number of power multiplying networks 203/253 employed. In this respect, multiple power multiplying networks 203/253 may be employed to provide adequate time for generating equipment to adjust to changing electrical loads without stressing the mechanical and electrical components of the generating equipment. Alternatively, the power stored in multiple ones of the power multiplying networks 203/253 may be applied to the power distribution network 300 concurrently to meet extreme load increases.

Furthermore, the elements that are employed to construct the various embodiments of the power multiplying networks 203/253 described herein may be constructed using low loss and high permittivity dielectrics in capacitances, and low loss conductors in the inductances (such as inductance coils). Such low loss conductors may be, for example, cryogenic conductors and/or superconductors. Such low loss conductors allow for much greater storage capacity at extremely high efficiencies. Specifically, given that power storage will increase in the power multiplying networks 203/253 as described herein until the losses experienced in the power multiplying networks 203/253 equal the power input, where a given power multiplying network is constructed of extremely low loss conductors, it follows that very large amounts of power may be stored.

Although the invention is shown and described with respect to certain embodiments, it is obvious that equivalents and modifications will occur to others skilled in the art upon the reading and understanding of the specification. The present invention includes all such equivalents and modifications, and is limited only by the scope of the claims.

What is claimed is:

1. A system for power smoothing in power distribution, comprising:
a plurality of power multiplying networks coupled to a power distribution network, where an individual power multiplying network of the plurality of the power multiplying networks comprises a multiply-connected, velocity inhibiting circuit constructed from a number of lumped-elements; and
where the individual power multiplying network is coupled to the power distribution network, the individual power multiplying network being configured to store power from and supply power to the power distribution network.

2. The system of claim 1, further comprising a diverter coupling the individual power multiplying network to the power distribution network, wherein a power output of the individual power multiplying network is applied to the power distribution network through the diverter.

3. The system of claim 1, wherein the individual power multiplying network is coupled to a demand stressed portion of the power distribution network.

4. The system of claim 1, wherein the individual power multiplying network is employed for power smoothing on the power distribution network.

5. The system of claim 2, wherein the diverter controls an amount of power supplied to the power distribution network in response to a load feedback signal.

6. The system of claim 4, wherein the individual power multiplying network supplies power to the power distribution network in response to an abrupt increase in an electrical load on the power distribution network, the individual power multiplying network supplying the power to the power distribution network to facilitate adjustment of power generation systems coupled to the power distribution network to supply power to the electrical load after the occurrence of the abrupt increase.

7. The system of claim 1, further comprising:
a launching network coupled to the power distribution network; and
a directional coupler coupling the launching network to the individual power multiplying network, wherein a power input of the individual power multiplying network is received from the power distribution network through the launching network and the directional coupler.

8. The system of claim 1, further comprising a plurality of diverters, a respective one of the diverters coupling a respective one of the plurality of power multiplying networks to the power distribution network, wherein a power output of the individual power multiplying network is applied to the power distribution network through the respective one of the plurality of diverters.

9. The system of claim 8, further comprising a control system electrically coupled to each of the plurality of diverters, the control system being configured to apply power from each of the plurality of power multiplying networks in a sequential order in response to a load feedback from the power distribution network.

10. The system of claim 8, further comprising a control system electrically coupled to each of the plurality of diverters, the control system being configured to apply power from at least two of the plurality of power multiplying networks concurrently in response to a load feedback from the power distribution network.

11. The system of claim 1, wherein the individual power multiplying network is constructed from superconducting elements.

12. The system of claim 1, wherein the individual power multiplying network is constructed from cryogenic elements.

13. The system of claim 1, wherein the individual power multiplying network further comprises a dynamic electrical passband.

14. A method for power smoothing in power distribution, comprising the steps of:
coupling a plurality of power multiplying networks network comprising a multiply-connected, velocity inhibiting circuit constructed from a number of lumped-elements to a power distribution network;
storing power from the power distribution network in at least one of the plurality of power multiplying networks; and
supplying power stored in the at least one power multiplying network to the power distribution network.

15. The method of claim 14, wherein a launching network is coupled to the power distribution network, and the launching network is coupled to the at least one power multiplying network using a directional coupler, the method further comprising the step of inputting power from the power distribution network into the at least one power multiplying network through the launching network and the directional coupler.

16. The method of claim 14, further comprising the step of diverting power from the at least one power multiplying network to the power distribution network with a diverter.

17. The method of claim 14, further comprising the step of coupling the at least one power multiplying network to a demand stressed portion of the power distribution network.

18. The method of claim 14, further comprising the step of using the at least one power multiplying network for power smoothing on the power distribution network.

19. The method of claim 18, further comprising the step of controlling an amount of power supplied to the power distribution network from the at least one power multiplying network with a diverter in response to a load feedback.

20. The method of claim 18, further comprising the step of supplying power to the power distribution network from the at least one power multiplying network in response to an abrupt increase in an electrical load on the power distribution network to facilitate adjustment of power generation systems coupled to the power distribution network to supply power to the electrical load after the occurrence of the abrupt increase.

21. The method of claim 14, further comprising the step of dynamically altering an electrical passband of the at least one power multiplying network.

22. A method for power smoothing in power distribution, comprising the steps of:
coupling a plurality of power multiplying networks to a power distribution network, each of the power multiplying networks comprising a multiply-connected, velocity inhibiting circuit constructed from a number of lumped-elements;
storing power from the power distribution network in each of the power multiplying networks; and
supplying power stored in the power multiplying networks to the power distribution network.

23. The method of claim 22, wherein each of the power multiplying networks is coupled to the power distribution network through a respective one of a plurality of diverters, the method further comprising the step of applying a power from each of the power multiplying networks to the power distribution network through a respective one of the diverters.

24. The method of claim 23, further comprising the step of applying power from the power multiplying networks to the power distribution network in a sequential order.

25. The method of claim 23, further comprising the step of applying power from at least two of the power multiplying networks to the power distribution network concurrently.

26. The method of claim 22, further comprising the step of dynamically altering an electrical passband of each of the power multiplying networks.

27. A system for power smoothing in power distribution, comprising:
a plurality of power multiplying networks coupled to a power distribution network, where individual ones of the plurality of power multiplying networks comprise a multiply-connected, velocity inhibiting circuit constructed from a number of lumped-elements;
means for storing power from the power distribution network in at least one of the plurality of power multiplying networks; and
means for supplying power stored in the at least one power multiplying network to the power distribution network.

28. The system of claim 27, wherein the means for storing further comprises:
a launching network coupled to the power distribution network; and a directional coupler coupling the launching network to the at least one power multiplying network.

29. The system of claim 27, wherein the means for supplying power further comprises a diverter coupling the at least one power multiplying network to the power distribution network.

30. The system of claim 27, wherein the at least one power multiplying network is coupled to a demand stressed portion of the power distribution network.

31. The system of claim 27, wherein the at least one power multiplying network is employed for power smoothing on the power distribution network.

32. The system of claim 27, further comprising means for dynamically altering an electrical passband of the at least one power multiplying network.

* * * * *